(12) United States Patent
Cheung et al.

(10) Patent No.: US 8,018,367 B2
(45) Date of Patent: Sep. 13, 2011

(54) N-BIT ADC READER

(75) Inventors: Chun Cheung, Brooklyn, NY (US);
Weihong Qiu, San Jose, CA (US);
Robert H. Isham, Flemington, NJ (US);
Mir Mahin, Holland, PA (US)

(73) Assignee: Intersil Americas Inc., Milpitas, CA (US)

( * ) Notice: Subject to any disclaimer, the term of this patent is extended or adjusted under 35 U.S.C. 154(b) by 12 days.

(21) Appl. No.: 12/631,998

(22) Filed: Dec. 7, 2009

(65) Prior Publication Data

US 2010/0171645 A1 Jul. 8, 2010

Related U.S. Application Data

(60) Provisional application No. 61/142,945, filed on Jan. 7, 2009.

(51) Int. Cl.
*H03M 1/12* (2006.01)

(52) U.S. Cl. .................. 341/155; 341/156; 341/154

(58) Field of Classification Search .......... 341/154–156, 341/166
See application file for complete search history.

(56) References Cited

U.S. PATENT DOCUMENTS

| 4,142,185 | A | * | 2/1979 | Gordon | 341/138 |
| 5,206,649 | A | * | 4/1993 | Gulczynski | 341/156 |
| 5,272,627 | A | * | 12/1993 | Maschhoff et al. | 378/4 |
| 5,717,396 | A | * | 2/1998 | Gross et al. | 341/166 |
| 6,211,803 | B1 | * | 4/2001 | Sunter | 341/120 |
| 7,075,472 | B1 | * | 7/2006 | Hsueh | 341/156 |
| 2006/0232461 | A1 | * | 10/2006 | Felder | 341/161 |

* cited by examiner

*Primary Examiner* — Jean B Jeanglaude
(74) *Attorney, Agent, or Firm* — Howison & Arnott, L.L.P.

(57) ABSTRACT

An integrated circuit has a single input pin for determining a value associated with a resistor divider. First circuitry determines a resistor ratio of the resistor divider through the single input pin. A first register stores a first group of bits representing the resistor ratio. The first group of bits represents the least significant bits of the value. Second circuitry determines an equivalent resistance of the resistor divider through the single input pin. A second register stores a second group of bits representing the equivalent resistance.

20 Claims, 11 Drawing Sheets

N-BIT ADC READER

CROSS-REFERENCE TO RELATED APPLICATIONS

This application claims the priority from U.S. Provisional Patent Application No. 61/142,945, entitled N-BIT PER PIN ADC READER, filed Jan. 7, 2009, which is incorporated herein by reference.

BRIEF DESCRIPTION OF THE DRAWINGS

For a more complete understanding, reference is now made to the following description taken in conjunction with the accompanying Drawings in which:

FIG. 5b in an alternative embodiment of the circuit in FIG. 5a;

FIG. 7 illustrates an alternative embodiment of the 8-bit ADC reader of FIG. 5a;

DETAILED DESCRIPTION

Figure 1:
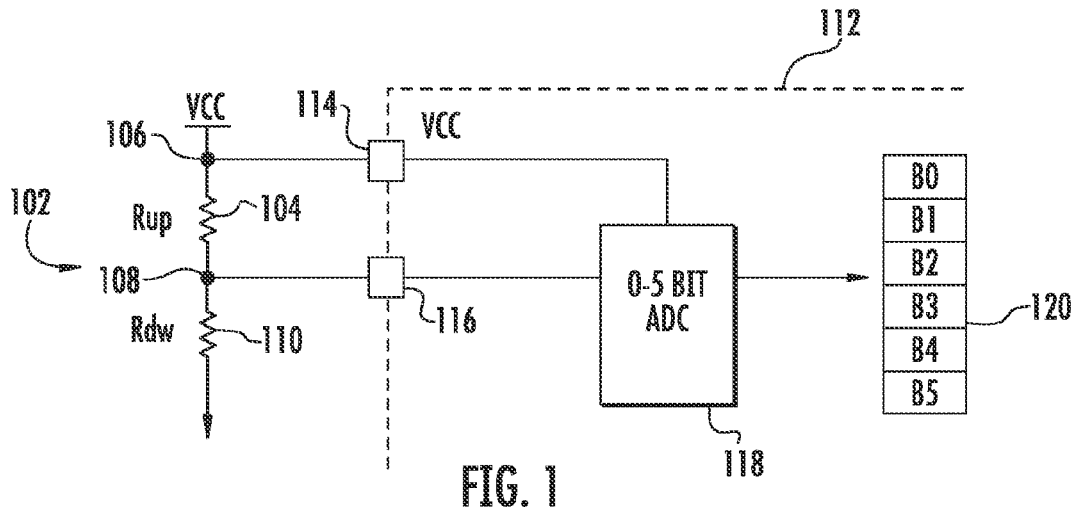
FIG. 1 illustrates a conventional ADC reader.

Referring now to the drawings, wherein like reference numbers are used herein to designate like elements throughout, the various views and embodiments of an improved n-bit pin ADC reader are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

There is a need to provide 8-bit accurate (approximately 0.4%) input data using a single pin of an integrated circuit and associated reader. Two existing methods for inputting data through a single pin involve either reading the value of an external resistor connected to an input pin or reading the ratio of external resistors used as a voltage divider between two reference voltages, such as the IC voltage supplies VCC and ground, that are connected with the pin. These methods require a very accurate (less than 1% error) current source and additionally require resistors having an accuracy of less than 1%. Inexpensive resistors normally utilized within these types of applications are limited to 1% accuracy.

Referring now to the drawings and more particularly to FIG. 1, there is illustrated a conventional method for implementing an ADC (analog-to-digital converter) reader using the resistor divider ratio method. In this configuration, the resistor divider 102 consisting of the resistor Rup 104 is connected between the reference voltage VCC at node 106 and node 108. Resistor Rdw 110 is connected between node 108 and ground. The IC circuit 112 is connected to the resistor divider 102 at a VCC pin 114 and a pin 116. The VCC pin 114 connects to node 106 of the resistor divider 102, and the pin 116 connects to node 108 of the resistor divider 102. A 6-bit ADC 118 is connected with pins 114 and 116 and is capable of storing the decoded value of the resistor divider 102 in a 6-bit memory register 120.

The resistor divider 102 is connected between VCC and GND and provides a desired input value to the pin 116 of the integrated circuit (IC) 112. The ADC 118 reads the ratio of the resistance Rup to resistance Rdw through pin 116 that is connected to the middle of the resistor divider 102 at node 108. This configuration suffers from the limitation of requiring a very accurate current source and resistors in order to accurately determine the value associated with the resistor divider 102.

Figure 2:
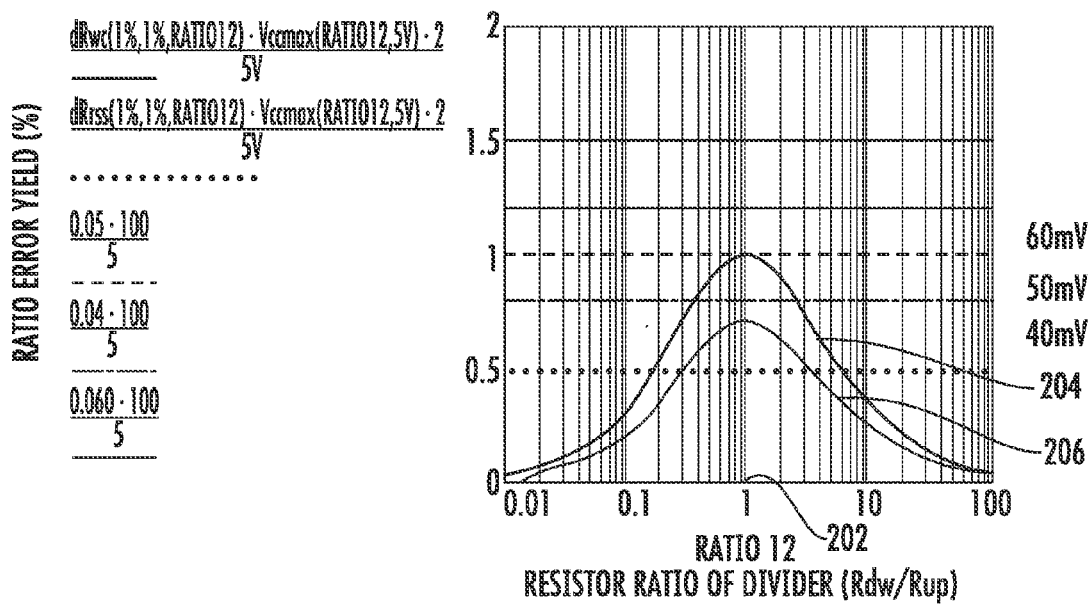
FIG. 2 illustrates the resistor ratio versus the ratio error for the circuit of FIG. 1.

Referring now also to FIG. 2, there is illustrated the resistor ratio versus the ratio error for the circuit of FIG. 1. FIG. 2 illustrates that the ratio error is worst at 50% represented by the line at point 202. This is true for both 1% accurate and 0.5% accurate resistors as represented by the lines 204 and 206, respectively. The ratio error can be seen to decrease when the resistor ratio either increases or decreases from the 50% point 202.

Figure 3:
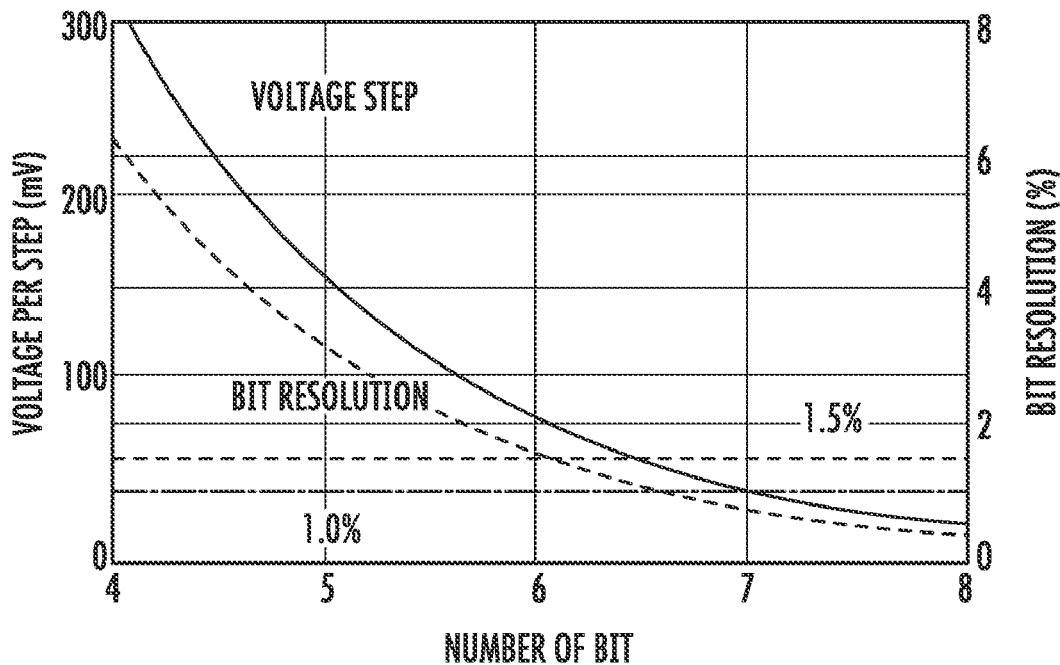
FIG. 3 illustrates the number of bits versus the bit resolution and voltage step that is required at 5 volts.

FIG. 3 illustrates the number of bits versus the bit resolution and voltage step that is required at 5 volts. As the number of bits increase, the voltage per step decreases. With a 5-bit per pin, 24-bit ADC, five pins are required for operation. However, an 8-bit per pin, 24-bit ADC will only require three pins for operation. Within pin limited packages, providing low cost solutions having a higher resolution analog-to-digital converter is preferred and the ability to provide 8-bit accuracy with only a single pin is greatly desired.

Figure 4:
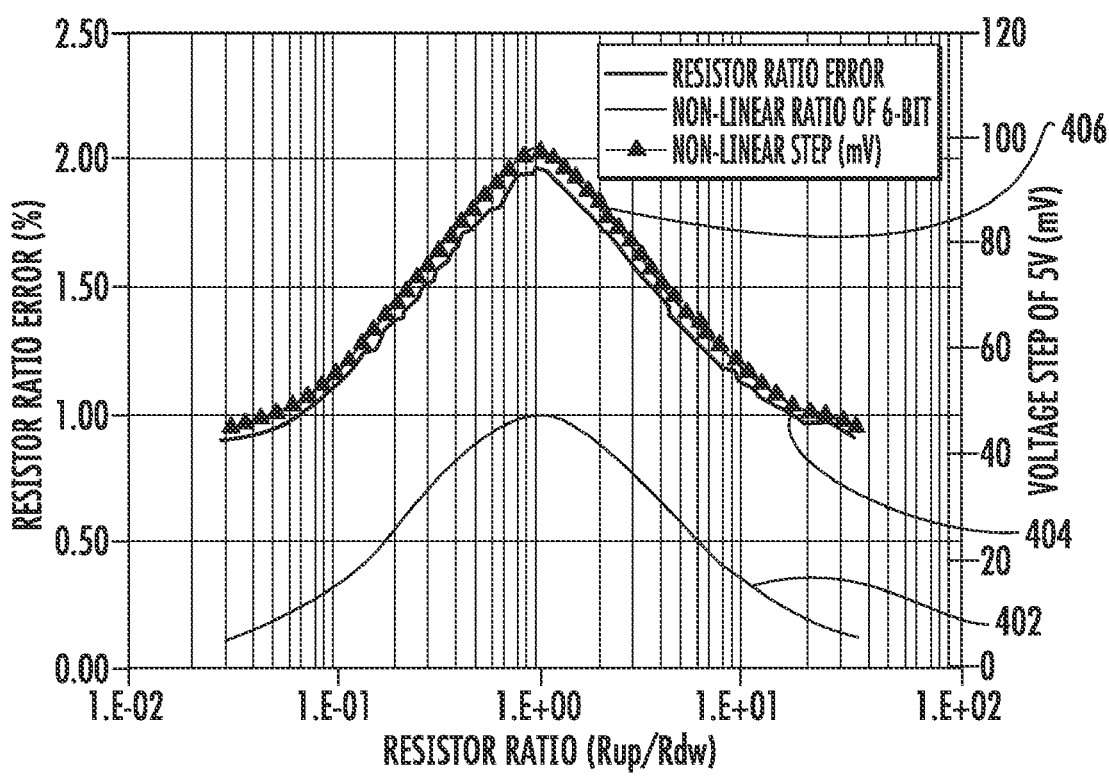
FIG. 4 illustrates the resistor ratio versus the ratio error and non-linear ratio of a fixed bit ADC reader.

FIG. 4 illustrates a resistor ratio versus ratio error in non-linear ratio of a 6-bit ADC. This figure illustrates that a 6-bit ADC can be achieved using a non-linear step with 1% accuracy resistors. A resistor divider can be used to provide two pieces of information. This information includes the ratio of the resistors within the resistor divider and the equivalent impedance of the resistors within the resistor divider. The ratio of the resistors can be used to determine the least significant bits LSB of a value represented by the resistor divider and the equivalent impedance can be used to determine the most significant bit MSB of a value represented by the resistor divider. Line 402 represents the resistor ratio error, line 404 represents the non-linear ratio of a 6-bit ADC and line 406 represents the non-linear step in millivolts.

Figure 5A:
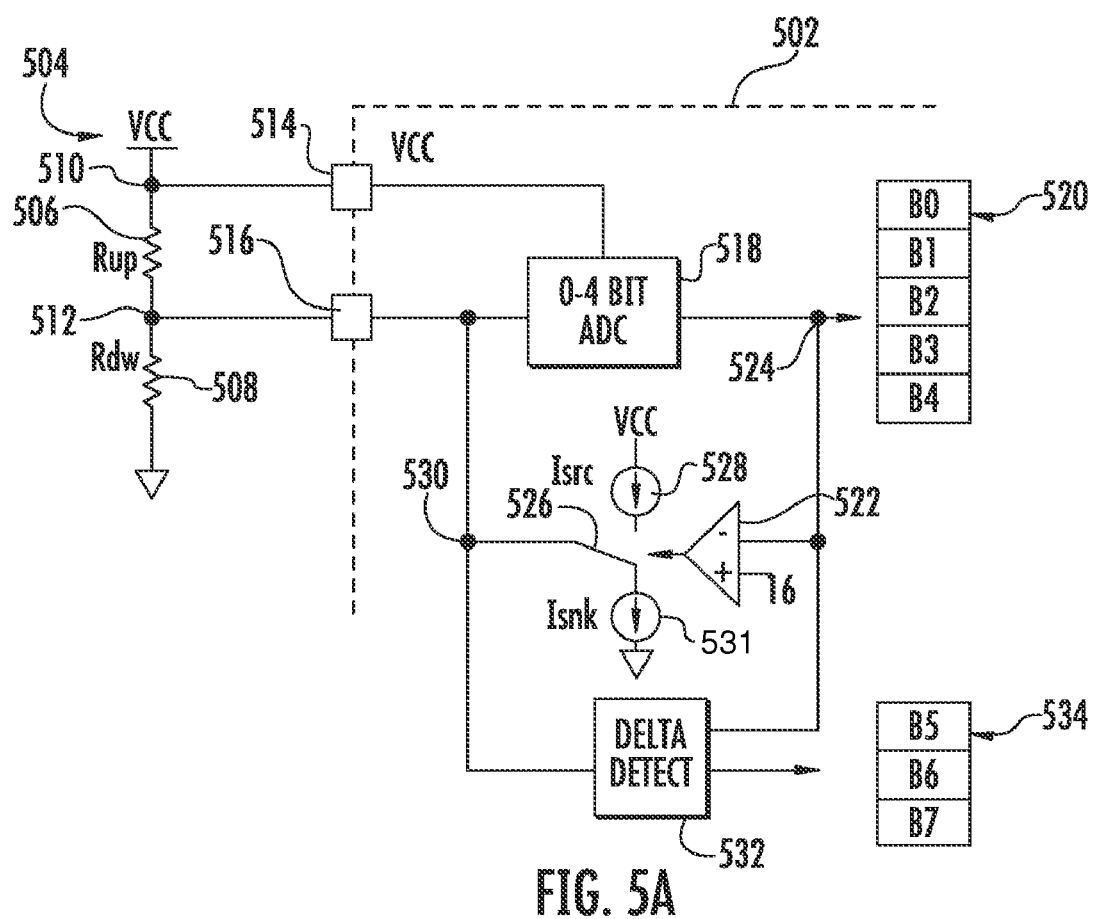
FIG. 5a is a block diagram of an 8-bit ADC reader.

Referring now to FIG. 5a, there is illustrated the circuitry for achieving an 8-bit ADC accuracy using a single pin and non-linear step with 1% resistors. The integrated circuit 502 is connected to a resistor divider network 504 consisting of the resistor Rup 506 and the resistor Rdw 508. The resistor Rup 506 is connected between the reference voltage VCC at node 510 and node 512. Resistor 508 is connected between node 512 and ground. Node 510 connects with the VCC pin 514 of the integrated circuit 502. Pin 516 of the IC 502 connects to the resistor divider at node 512. The ratio between the resistors Rup 506 and Rdw 508 are selected to correspond to some desired value. Additionally, the equivalent resistance of the two resistors 506 and 508 in parallel are also selected to correspond to some value. Within the resistor divider 504, the greatest degree of accuracy is achieved when one resistor is a very large ratio with respect to the other resistor and the least accuracy is achieved when the resistors are equal. For this reason, it is most advantageous to make the divider steps that the integrated circuit 502 is trying to resolve larger near the center of the divider range (VCC-GND)/2. To allow for practical considerations of commercially available resistors and other considerations such as supply current (from low resistor values) and input bias or noise restrictions (from two high values), the range of resistor divider ratios would likely not extend all the way to the reference points VCC and GND.

A 5-bit analog-to-digital converter (ADC) reader 518 is connected to the VCC reference voltage at pin 514 and to the resistor divider via pin 516. The 5-bit ADC reader can store the least significant bit (LSB) values of a value represented by a resistor ratio of the resistor divider 504 within a 5-bit memory register 520. The analog-to-digital converter reader 518 that reads the resistor ratio of the resistor divider 504 can be non-linear in order to make the divider steps of the resistor divider resolve larger near the center of the divider range.

A comparator 522 is connected to node 524 at its inverting input. The non-inverting input of comparator 522 is connected to a reference voltage representing the midpoint between VCC and GND. The output of the comparator 522 is connected to a switch 526 that selects between a source current source 528 and a sink current source 530. The other side of switch 526 is connected to node 531 which is connected to the pin 516 associated with the resistor divider 504. A delta detect circuit 532 is connected between node 524 and node 530 to measure the equivalent impedance of the resistor divider 504. Based upon the measurements of the equivalent impedance, the delta detect circuit 532 stores the most significant bits of the measured values of a value represented by a resistor ratio of the resistor divider 504 within a memory register 534.

The integrated circuit 502 reads the resistor ratio of the resistor divider 504 using the 5-bit analog-to-digital converter reader 518 to an accuracy obtainable by the accuracy of the resistors making up the resistor divider 504 plus the accuracy of the 5-bit ADC reader 518. 5-bit accuracy of the ADC reader 518 of approximately 3% is easily obtainable when using 1% accuracy resistors within the resistor divider 504. The determination of the resistor ratio within the resistor divider 504 would typically be made by the ADC 518 that has the same voltage reference points such as VCC and GND as the resistor divider 504. After determining the 5-bit resistor ratio value of the resistor divider 504 and storing this within the memory register 520 associated with the LSB of the resistor divider value, the integrated circuit 502 will next apply a current to the pin 516 in order to obtain a reading of the equivalent resistance of the two resistors Rup 506 and Rdw 508 of the resistor divider 504. The determination of the equivalent resistance is made by measuring the change in voltage at pin 516 between when no current is applied to the pin 516 and when one of a sinking or a sourcing current is applied to the pin 516.

The current source that is applied to the pin 516 may either be a source current 528 or a sink current 530 as described herein above. The source current 528 and sink current 530 are selected via the comparator 522. This allows for operation of the delta detect circuit 532 that measures the equivalent resistor of the resistor divider 504. If the comparator 522 determines that the resistor divider 504 would place the IC pin 516 above the mid point of VCC-GND, the sinking current 530 would be used to measure the impedance of the resistor divider network 504. If the comparator 522 determines that the resistor divider 504 would place the IC pin 516 voltage below the mid point of VCC-GND, the sourcing current 528 is applied. This enables the circuit to operate in a better common mode voltage range.

The delta detect circuit 532 determines the equivalent impedance of the resistor divider 504 responsive to the current applied to pin 516 to 3-bit accuracy. This 3-bit accurate value is stored within the memory register 534. The 3-bit value comprises the most significant bits of the value represented by the resistor divider 504. Using the configuration described with respect to FIG. 5a, the delta detect circuitry 532 may achieve 3-bit accuracy (approximately 12%) with the accuracy of the internal current source likely to be the limiting factor. By combining the resistor ratio value for the 5-bit LSB stored in register 520 with the 3-bit MSB value stored in register 534, 8-bit accuracy of the value represented by the resistor divider 504 may be achieved.

If additional pins can be spared at least one end of the resistor divider 504 can be connected to a pin on the IC 502 that includes a series switch to a reference voltage. In this manner, after obtaining a first reading, the divider circuit 504 could be disconnected from the reference voltage and no wasted current would flow. To maintain accuracy, the internal analog-to-digital converter reader 518 that reads the divider ratio would also be connected to the same side of the switch as the external resistor divider 504. If more than the resistor divider 504 was to be used, for instance for multiple 8-bit inputs, all of the dividers could share one pin and switch to the reference voltage.

Figure 5B:
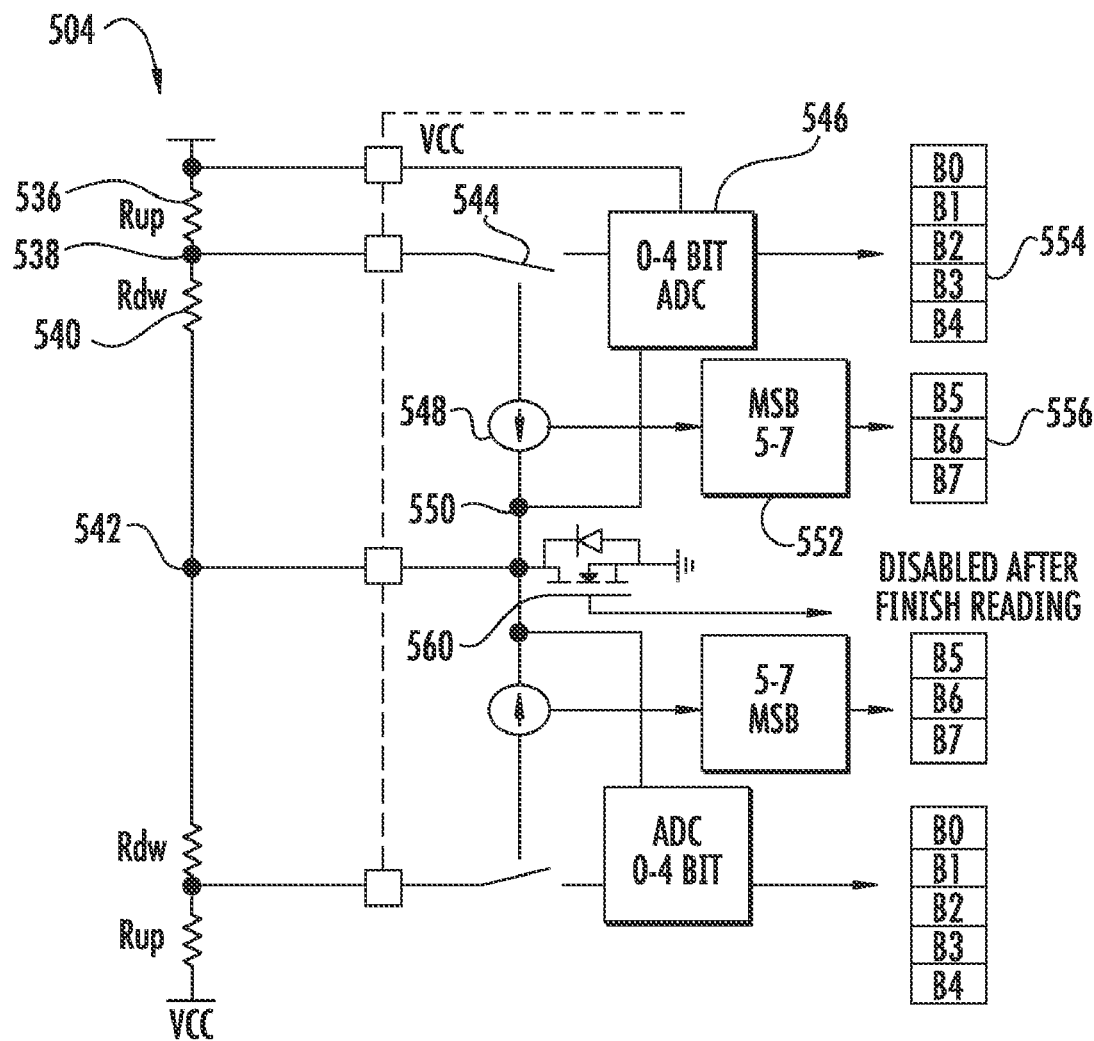

This embodiment is more particularly illustrated in FIG. 5b. The resistor divider 504a consists of a first resistor 536 connected between VCC and node 538 and a second resistor 540 connected between node 538 and node 542. The switch 544 is connected to a pin connected with node 538 and connects node 538 to either the 0-4 bit ADC 546 or current source 548. The current source 548 is connected between the switch 544 and node 550 that is also connected with the 5 bit ADC 546. The current source 548 also provides an input to the 5-7 bit MSB block 552. The 0-4 bit ADC stores generated bits in a memory register 554 and the 5-7 bit MSB block 552 stores the information in a register 556. Node 542 is connected to ground through a switch 560. The lower portion of the circuit illustrated in FIG. 5b is the same as that described above and shares a return pin to save bias current. FIG. 5b illustrates that a pin can be the return of all the resistor divider networks and all networks are removed from ground after the ACD reading is completed via transistor switch 560. This yields a lossless reader. Furthermore, the circuit can set popular registers by tying the pin high and low which is also lossless.

Figure 6:
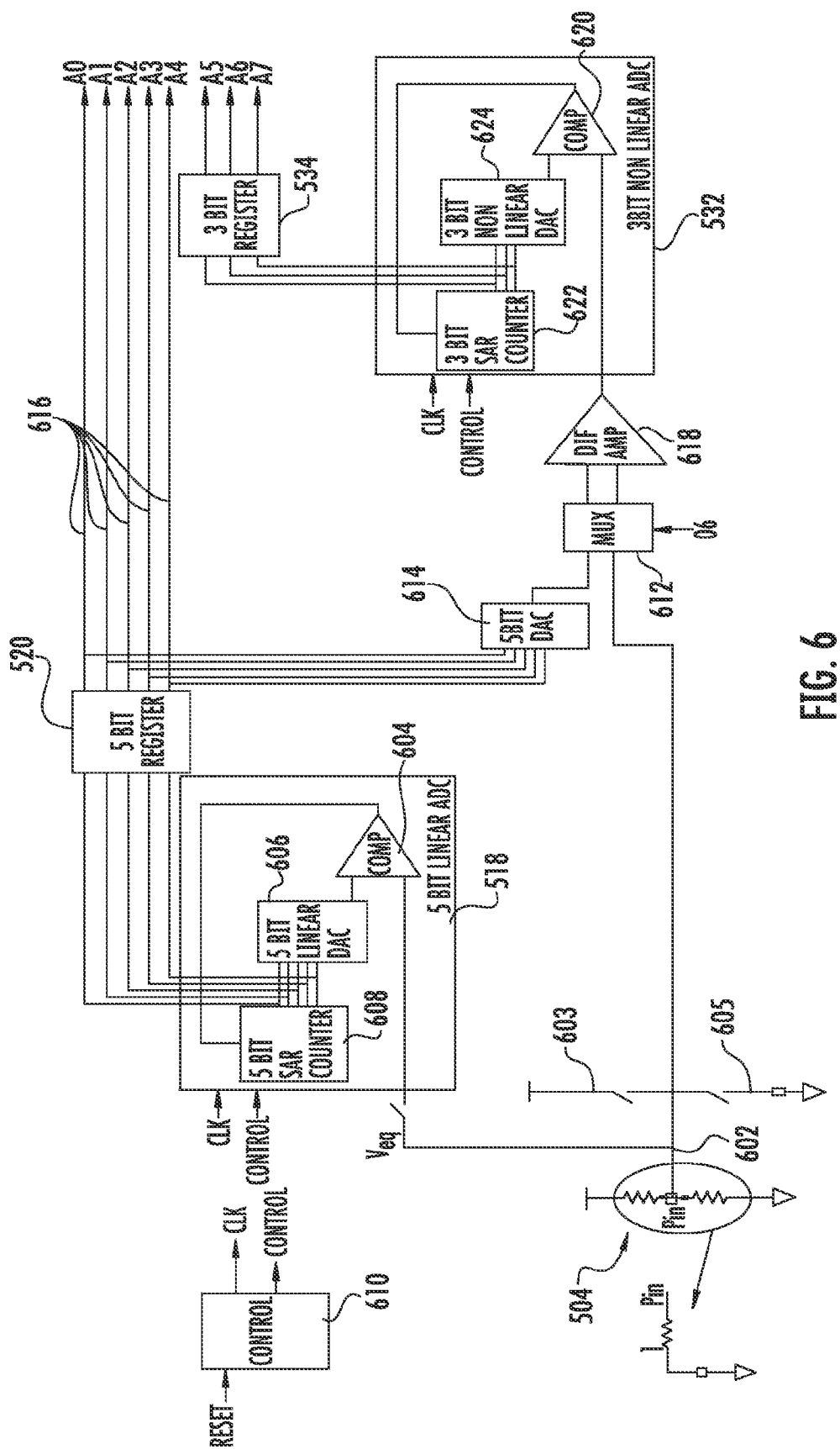
FIG. 6 is a more detailed illustration of the 8-bit ADC reader using 5-bit LSB reading with a linear ratio and 3-bit MSB reading using non-linear step.

Referring now to FIG. 6, there is provided a more detailed circuit implementation of the 8-bit resistance reader. The resistor divider 504 is connected with the 5-bit linear ADC 518 at node 602. The 5-bit ADC 518 consists of a comparator 604 having one input connected to node 602 and the other input connected to the output of a linear digital-to-analog converter 606. The output of the comparator 604 is provided to the input of a 5-bit SAR counter 608. The 5-bit SAR counter 608 is connected to the 5-bit linear digital-to-analog converter 606. Each of these are also connected to the 5-bit register 520 for storing the LSB bits of the value of the resistor ratio measured from resistor divider 504. The 5-bit ADC 518 receives clock and control values from the control circuit 610.

Node 602 associated with the resistor divider 504 is also connected to a first input of a multiplexer 612. A current source is provided through node 602 by closing the switch 603. A current sink is provided through node 602 by closing switch 605. A second input of the multiplexer 612 is connected to the output of a 5-bit digital-to-analog converter 614. The input of the digital-to-analog converter 614 is connected to a bus 616 connected to the output of the 5-bit register 520. The outputs of the multiplexer 612 are connected to the input of a differential amplifier 618. The output of the differential amplifier 618 is connected to the input of a comparator 620 within a 3-bit non-linear analog-to-digital converter that comprises the delta detect circuit 532. The output of the comparator 620 is provided to the input of a 3-bit SAR counter 622. The output of the SAR counter 622 is connected to the input of a non-linear digital-to-analog controller 624. The non-linear digital to analog 3-bit controller 624 provides a second input to the comparator 620. The output of the SAR counter 622 is also provided to a 3-bit storage register 534 providing the most significant bits of the value determined with respect to the resistor divider 504. The 3-bit non-linear analog-to-digital controller also receives clock and control signals from the controller 610.

Figure 7:
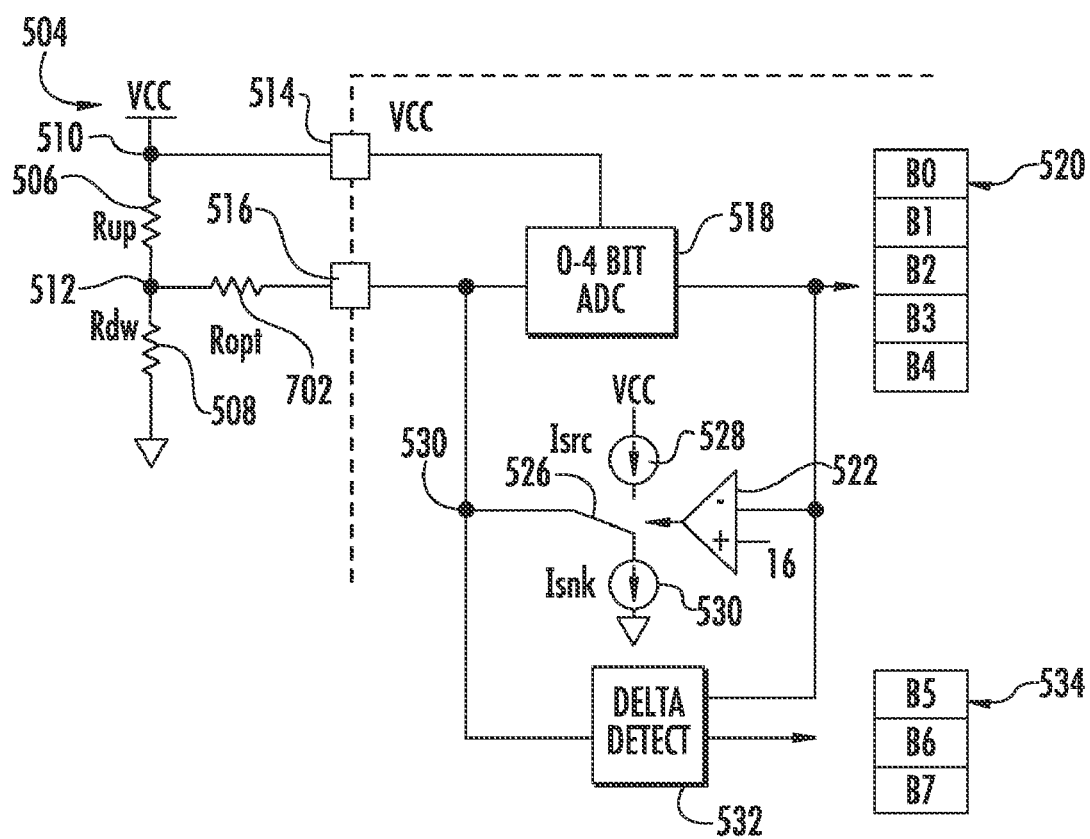

Referring now to FIG. 7, there is illustrated an alternative embodiment of the circuit of FIG. 5a wherein an additional resistor 702 is included between node 512 of the resistor divider 504 and the input pin 516. The resistor 702 extends the range of possible impedances that may be measured by the delta detect circuitry 532. This resistor would negate the limitations of input bias or noise restrictions that prevent the resistor divider ratios from extending all the way to the reference voltages at the cost of an additional external resistor component.

Within the implementation described with respect to FIGS. 5a and 6, the first 5 LSB bits are read through the resistor ratio using the linear/non-linear step while the next 3 MSB bits are read through the open impedance of the resistor divider using a non-linear step. Both ends of the ratio (less than 20% and greater than 80%) are not used for the LSB readers to keep resistors within the 1 megaohm range. The current source applied to the pin 516 and the comparator reference must be accurate (within 5%-10% in one embodiment). The resistor 702 of FIG. 7 is an optional resistor that provides more flexibility for impedance reading and resistor choices.

Figure 8:
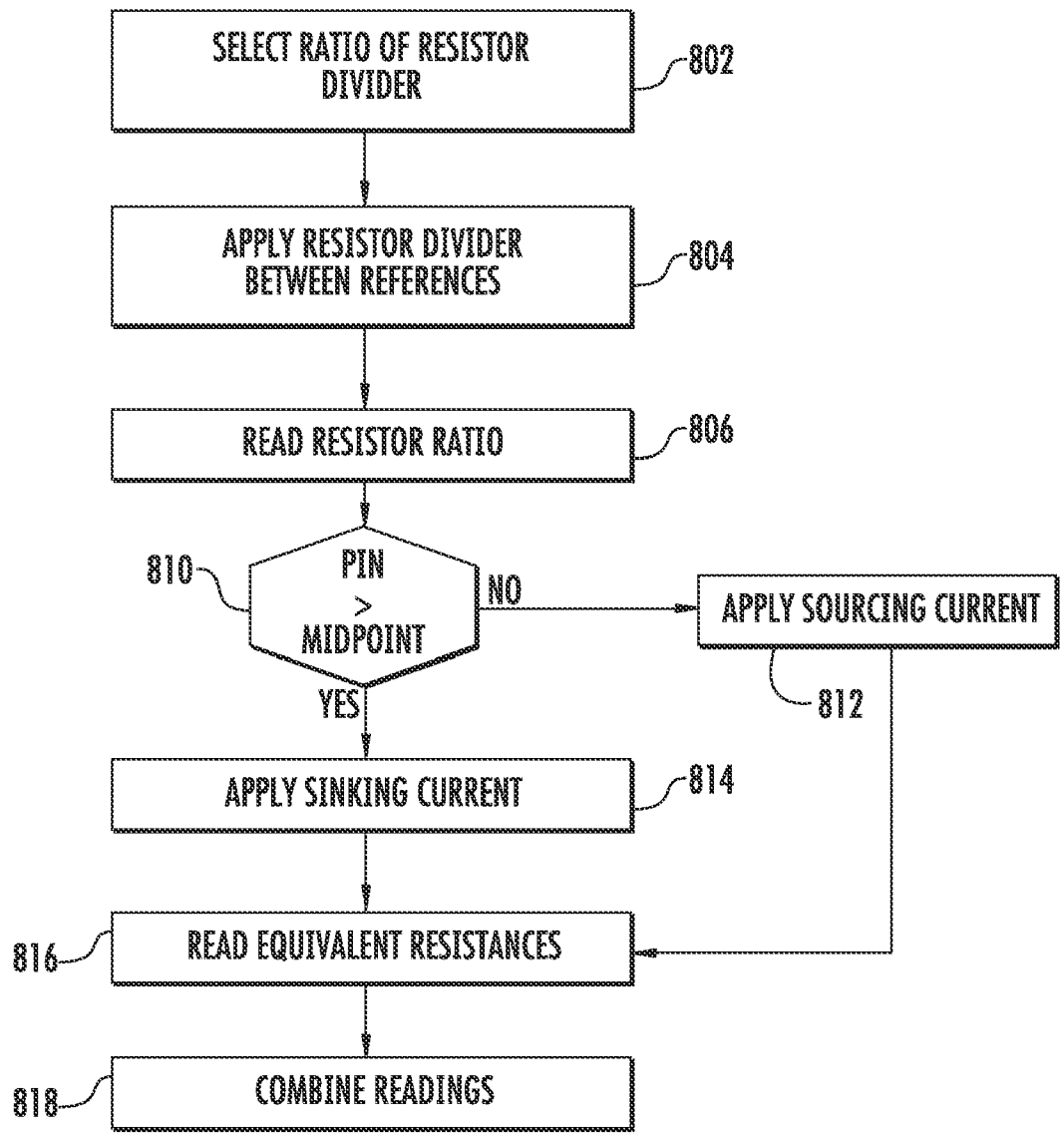
FIG. 8 is a flow diagram describing the operation of the 8-bit ADC reader.

Referring now to FIG. 8, there is illustrated a flow diagram describing the operation of the circuit of FIG. 5a. Initially, the necessary ratio and equivalent resistance of the resistor divider 504 to provide the desired values is selected at step 802. Using the established resistor values, the resistor divider 504 is applied between a pair of reference voltages such as VCC and GND at step 804. Next, using the 5-bit analog-to-digital converter 518, the ratio of the resistors within the resistor divider 504 are read and stored within the 5-bit register 520 at step 806. Next, inquiry step 810 determines whether the voltage at pin 516 is greater than the mid point of the difference between the reference voltage VCC and the reference voltage GND. If not, a sourcing current from current source 528 is applied to pin 516 at step 812. If the voltage will be greater than the mid point of VCC-GND then the sinking current is applied to pin 516 at step 814. Next, at step 816, the equivalent resistance of the resistor divider 504 is determined at step 816 from the difference of the voltage at pin 516 when the sourcing or sinking current is applied and when no current is applied and this value may then be stored within the 3-bit register 534. The readings associated with the least significant bits from the 5-bit register indicating the resistor ratio and the 3-bit readings associated with the equivalent resistance representing the most significant bits are combined at step 818 to create the equivalent 8-bit value derived from the resistor divider 504.

Figure 9:
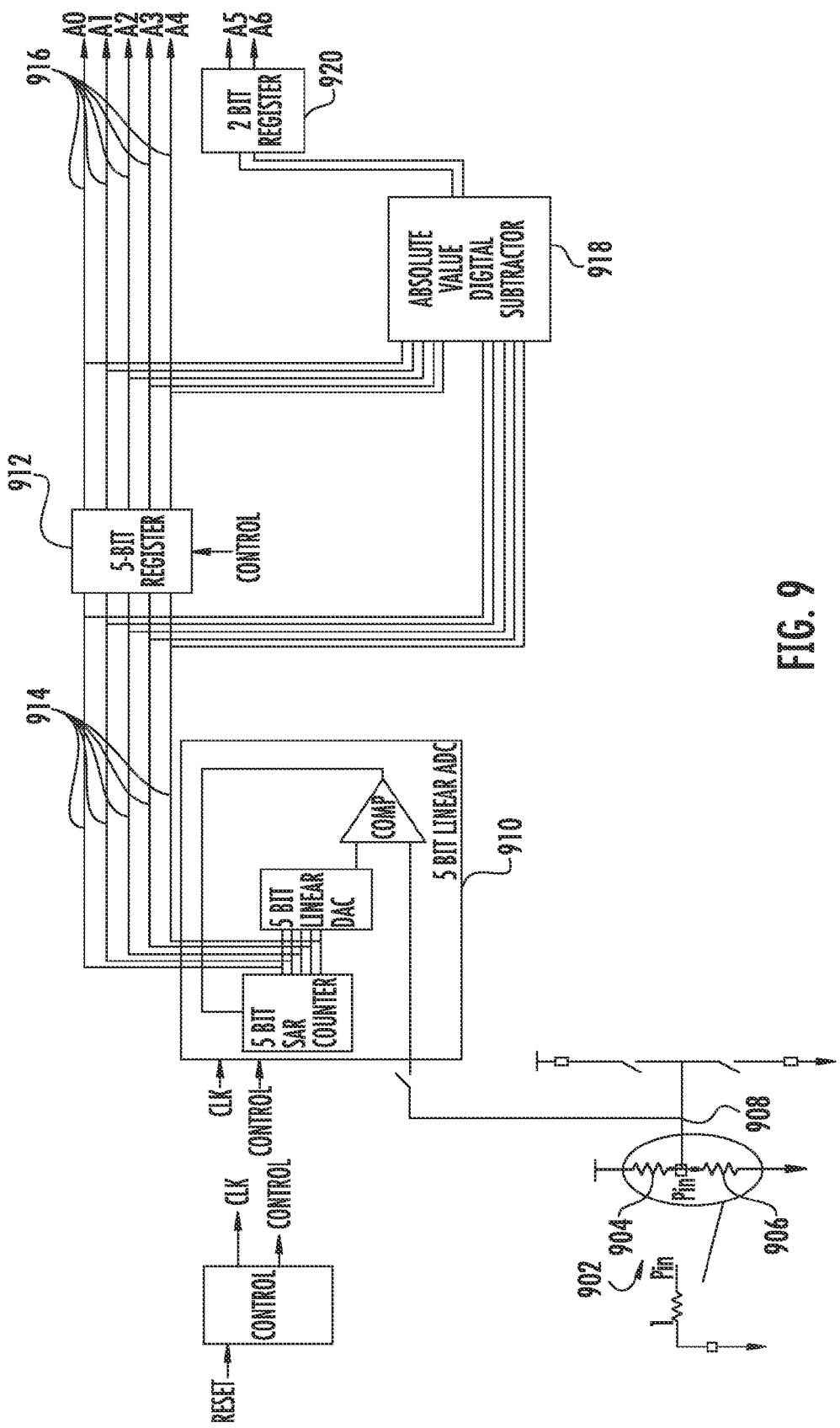
FIG. 9 illustrates a 7-bit ADC reader using 5-bit LSB and 2-bit MSB using linear step.

Referring now to FIG. 9, there is illustrated a simple 7-bit ADC implementation using a linear approach. The 7-bit and 8-bit implementations only differ in that the 8-bit version uses non-linear steps to gain extra resolution. The basic operation is the same. The output is a combination of a reading of the ratio of an external divider, and the equivalent impedance of that divider. A resistor divider 902 consisting of a resistor 904 and a resistor 906 is connected between VCC and GND in series. The integrated circuit is connected to the resistor divider 902 at node 908. Connected to node 908 is a 5-bit linear ADC 910 which is configured in a manner similar to that described with respect to the 5-bit ADC 518 described with respect to FIG. 6. The output of the 5-bit ADC is connected with a 5-bit register 912. The center point of the resistor divider 902 is first read and stored by the 5-bit ADC 518. The reference for the ADC 518 should be the same as what the resistor divider is connected across, typically VCC and GND, so that there is no reference accuracy involved. Thus, if VCC varies, the reference for the ADC and the input to the resistor divider change by the same amount, so the reading won't change.

Connected to an input bus 914 of the 5-bit register 912 and an output bus 916 of the 5-bit register 912 is an absolute value digital subtractor circuit 918. The absolute value digital subtractor 918 determines a 2-bit value which is stored within a 2-bit register 920. After taking a reading of the resistor divider 902, the system applies a current source or current sink to the resistor center point at node 908. To keep the center point within the common mode capability of the system, the polarity of that current is dependent on whether the first reading was above or below the midpoint of the reference, for this example, VCC/2. If the original reading was below VCC/2, and a sink current was applied, it could be that the center point would try to go below GND, outside the range of the ADC or the current sink. For that reason an original reading of below VCC/2 would cause a source or pull-up current to be applied, and a sink or pull-down current for an original reading above VCC/2.

A second 7-bit reading is then taken. The voltage difference between the first (no current) reading and the second reading with the sinking or sourcing current enables a determination of the equivalent impedance of the resistor divider 902. As the same ADC is used for first and second readings, the only variable is the current sink or source, which has to be accurate (5%-10% in one embodiment). As the second reading may be above or below the first depending on whether a source or sink current was used, the resulting difference may be positive or negative. This may be accounted for by inverting the answer appropriately, or take an absolute value.

To avoid budgeting a large error for the resolution of the ADC, an ADC with more resolution than needed is used and the result is rounded off. For instance, a perfect ADC would still have ½ bit quantizing error. (The input can vary by +/−½ bit and produce the same reading.) Even if everything else was perfect, and only a 2 bit ADC were used, we would still have potentially up to a 1 bit error when the first and second readings were subtracted. If a 3 bit ADC were used, we would only have a ½ bit error, etc. So, by using a higher resolution ADC, subtracting the readings, taking on absolute value (or inverting the value depending on knowledge of current polarity) of the result, and rounding down to the required number of bits, the 7-bit value is determined.

Figure 10:
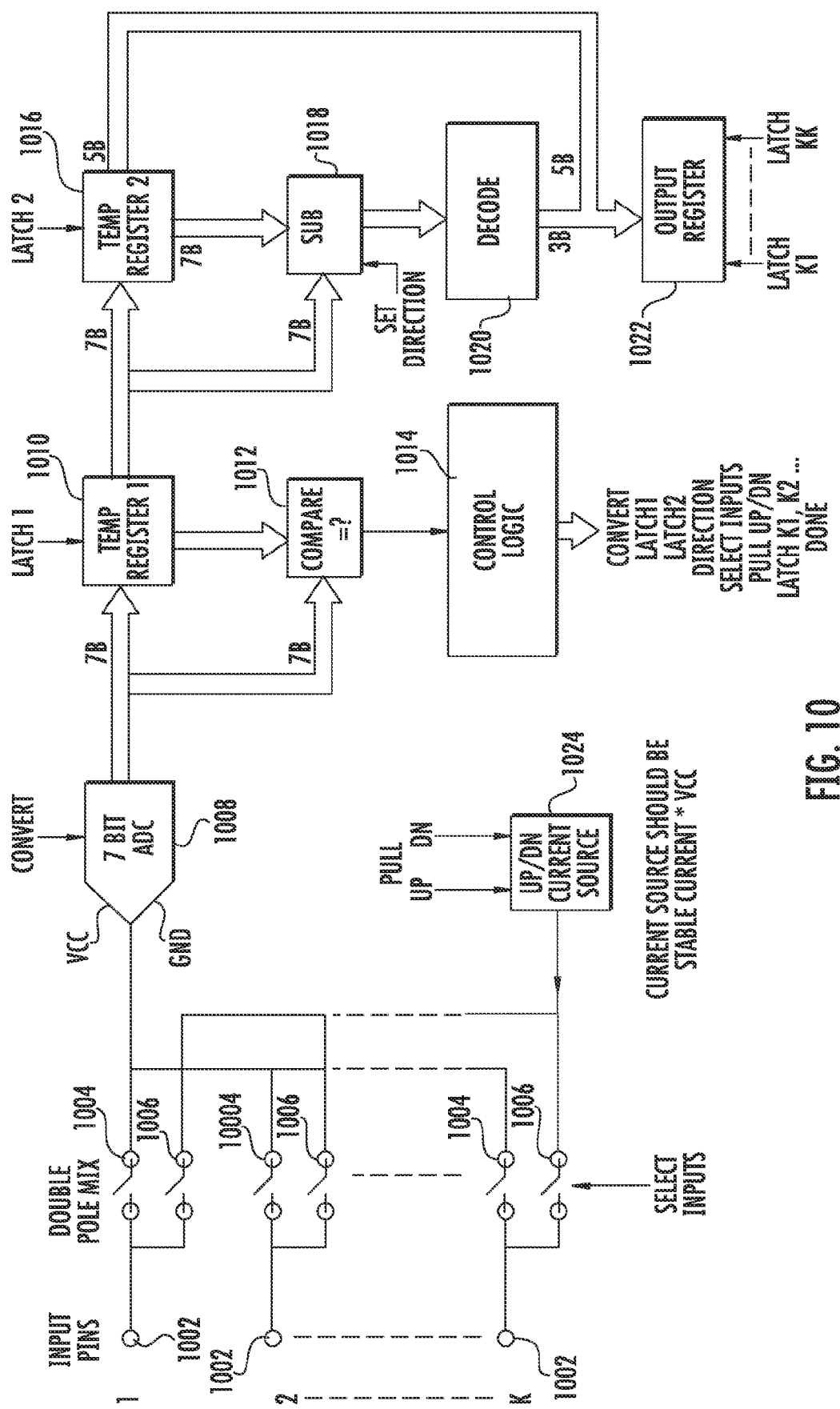
FIG. 10 illustrates a block diagram of the ADC reader.

Referring now to FIG. 10, there is illustrated a block diagram of a further embodiment of an 8-bit reader circuit. Each channel is connected to the resistor divider at an input node 1002. The channel is connected to a remainder of the circuitry via a switch 1004. A current source or current sink is connected to the input node 1002 via a second switch 1006 as will be described more fully herein below. The current source or current sink is provided via a current source 1024. The up/down current source 1024 is used for impedance reading. The resistance divider voltage is read initially without the current source 1024. The current source or sink is then turned on and the voltage is read again. By subtracting the first voltage reading (with the current off) from the second voltage reading (with the current on), the impedance times current value may be obtained. If the first voltage reading is higher than half of the digital-to-analog converter range, then the current sink (PULLDN CURRENT) is turned on. If the first voltage reading is higher than half of the DAC range, the current source (pull up current) is turned on.

The input node 1002 connects to the input of a 7-bit analog-to-digital converter 1008. The output of the analog-to-digital converter 1008 provides a 7-bit value to a first register 1010 and to a comparison logic circuit 1012. The comparison logic 1012 compares the contents of register 1010 with the output of the 7-bit ADC to determine if they are equal. The output of the comparison logic 1012 goes to control logic 1014 for generating the various control signals to the reader circuitry as will be more fully described herein below. The output of the register 1010 is provided to a second register 1016 and to a subtraction logic 1018. The register 1016 is for temporarily storing converted values, and the subtractor logic 1018 subtracts the values in the registers 1010 and 1016 from each other responsive to a set direction control signal from the control logic 1014.

Decoding logic 1020 performs a non-linear decoding operation to convert a subtracted 7-bit code from subtractor logic 1018 to generate a 3-bit code. Finally, an output register 1022 is used for storing the 8-bit decoded value generated by the reader circuitry. The three bits from the decoding circuitry 1020 are used for the three most significant bits of the value being read and the five most significant bits within the temp register 1016 are used as the 5 least significant bits within the output register 1022. The up/down current source 1024 is used for generating a current source or current sink to the input pins 1002 through switch 1006 responsive to the pull up and pull do control signals from the control logic 1014.

Figure 11A:
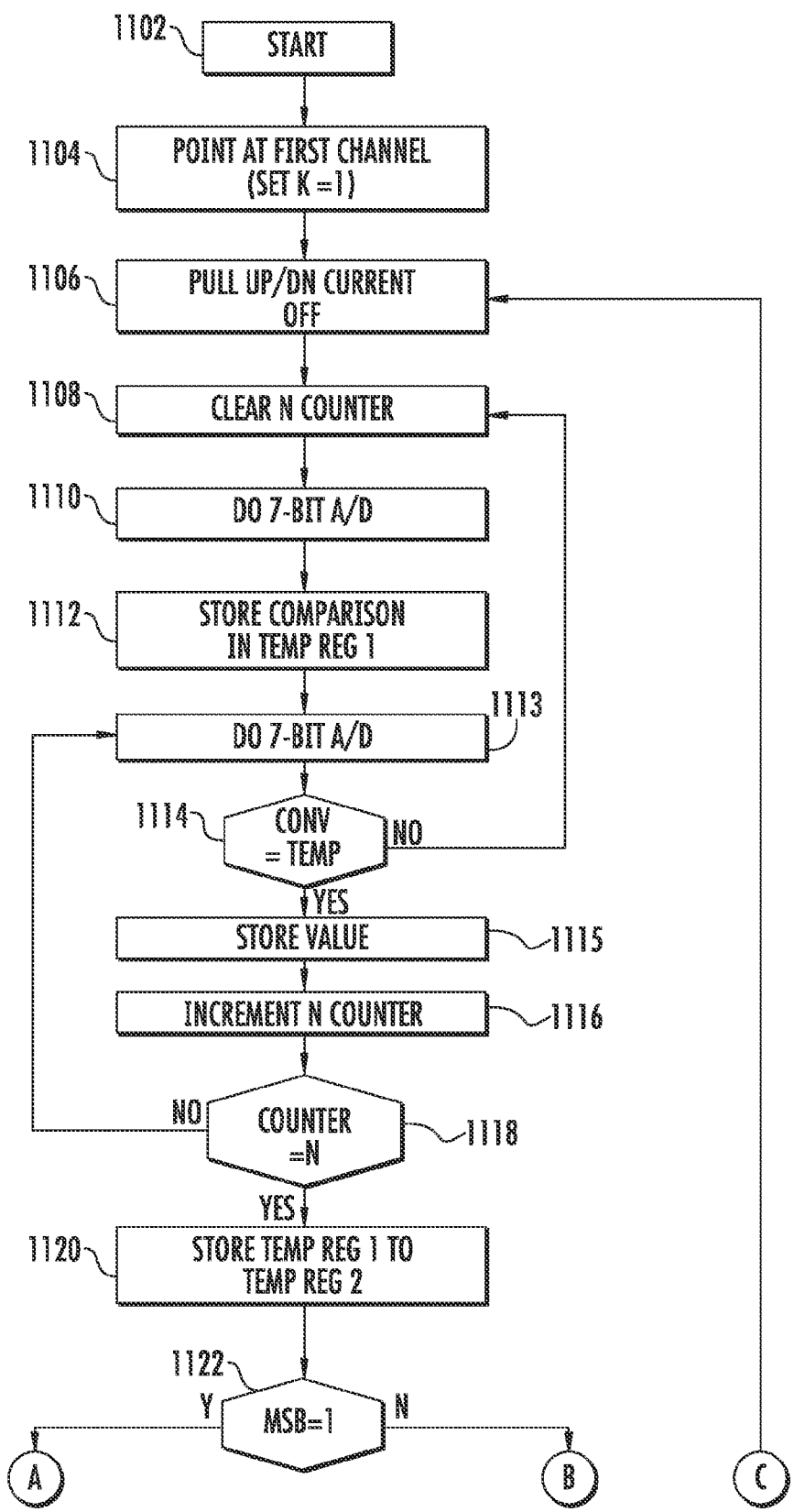
FIGS. 11a and 11b is a flow diagram illustrating the operation of the circuit of FIG. 10.
Figure 11B:
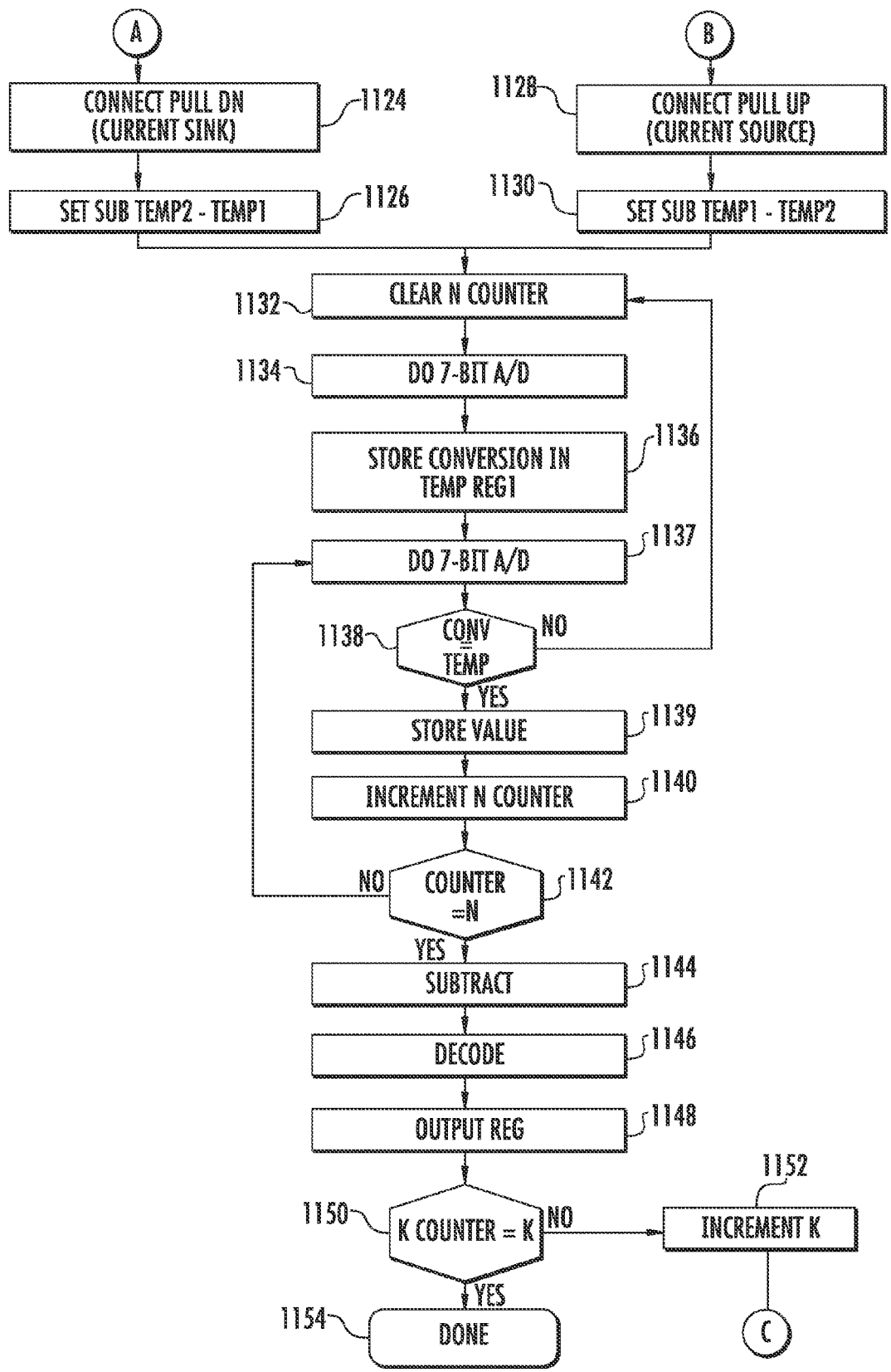

Referring now to FIGS. 11a to 11b, there is illustrated a flow diagram describing the operation of the circuitry of FIG. 10. As described previously, there are k numbers of channel inputs 1002 to the ADC reader. A resistance divider circuit is connected to each of the channel inputs 1002 from VCC to ground. The process is initiated at step 1102. The first channel is selected at step 1104 by setting the channel indicator k equal to 1. This selects the resistance divider of channel 1. The up/down current source 1024 is also turned off at step 1106. The n counter is also cleared to zero at step 1108. The voltage at the input of the 7-bit ADC 1008 is read and converted to a 7-bit code at step 1110. The 7-bit code is stored within temp register 1010 at step 1112.

A second analog-to-digital conversion is performed on the input voltage at step 1113. Inquiry step 1114 performs a comparison using the comparison logic 1012 to determine if the present conversion value at the output of the 7-bit ADC 1008 is equal to the temporary value stored within temp register 1 1010. For purposes of the comparison the values are considered to be equal if they are within one LSB of each other. If these values are not equal, the process returns back to step 1108 to begin again. If the output of the 7-bit ADC is equal to the value within register 1010, the present output of the 7-bit ADC 1008 is stored at step 1115 within the temp register 1010, and the n counter value is incremented at step 1116. Inquiry step 1118 determines if the n counter value is equal to n. If not, another 7-bit conversion is performed on the input voltage value at step 1113. The analog-to-digital conversion is performed n times to ensure that noise does not corrupt the data being input at the input voltage node. If n consecutive times the analog-to-digital conversion is the same, then the data is assumed to be ok. If inquiry step 1118 determines that the n counter value is equal to n, the value presently stored within temp register 1 1010 is stored at step 1120 within the temp register 2 1016.

Inquiry step 1122 determines if the most significant bit within the register 1010 and register 1016 is equal to 1. If so, the control logic 1014 generates an indicator to have the up/down current source 1024 to act as a current sink at step 1124. The current source is then applied to the input node 1002. The control logic 1014 also sets, at step 1126, the subtractor logic 1018 to subtract the temp 1 register 1010 from the temp 2 register 1016. If inquiry step 1122 determines that the most significant bits within temp registers 1 and 2 do not equal 1, the up/down current source 1024 is configured as a current source at step 1128, and a current source is applied to the input node 1022. The subtraction logic 1018 is also set to subtract the temp 2 register 1016 from the temp 1 register 1010.

After the subtraction logic 1018 is configured, and the current sink or source from the up/down current source 1024 is applied to the input node 1002, the n counter is reset at step 1132. The input voltage applied at node 1002 along with the current source or sink is applied to the input of the 7-bit ADC converter 1008 is used to generate a new 7-bit code from the ADC 1008. This code is stored within the temp register 1 1010 at step 1136. A second analog-to-digital conversion is performed on the input to the ADC 1008 at step 1137. Inquiry step 1138 determines if the output of the ADC 1008 is equal to the value stored within the temp register 1010 using comparison logic 1012. If not, control passes back to step 1132 and the process begins again. For purposes of comparison, if the values are within 1 LSB of each other they are considered to be equal. If inquiry step 1138 determines that the output of the ADC 1008 is equal to the value stored within the temp register 1010, this value from the ADC 908 is stored within the temp register 1010 at step 1139, and the n counter is incremented at step 1140. Inquiry step 1142 determines if the value of the n counter is equal to n. If not, control passes to step 1137 to perform another analog-to-digital conversion on the input signal. The process repeats until the value of the n counter is equal to n to assure that the input data is not corrupt.

Once the n counter value equals to n, a subtraction process is performed at step 1144 using the subtraction logic 1018. The subtraction will either subtract the temp 1 register 1010 from the temp 2 register 1016 or the temp 2 register from the temp 1 register depending on the settings established back at steps 1126 or 1130. The subtracted value is provided to the decoding logic 1020 to provide a three bit code from the 7 bit code provided from the subtraction logic 918 at step 1146. This is a non-linear decoding performed by the decode logic 1020. The generated codes are latched to the output register at step 1148 for the channel presently being read. The five most significant bits of the temp register 2 1016 are used as the five least significant bits of the output register 1022. The decoded 3-bit value generated by the decode logic 1020 are used as the three most significant bits of the output register 1022.

Inquiry step 1152 next determines if all channels have been checked by determining if the k counter value is equal to k. If not, the value of k is incremented at step 1152 and the process returns back to step 1106. If inquiry step 1150 determines that the k counter value is equal to k, the process is completed at step 1154.

Using the above described circuitry the resistor divider can be read to provide two different pieces of information; the ratio of the resistors within the resistor divider and the equivalent impedance of the resistors within the resistor divider. The ratio of resistors can be used to determine the least significant bits of the value associated with the resistor divider. The equivalent impedance can be used to determine the most significant bits of the value associated with the resistor divider. Thus, using each of these pieces of information in the manner described, a single pin may be used to achieve 8-bit accuracy while reading a value associated with the resistor divider.

It will be appreciated by those skilled in the art having the benefit of this disclosure that this improved n-bit pin ADC reader provides an improved single pin bit accuracy. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit including a single input pin for determining a value associated with a resistor divider, comprising:
    first circuitry for determining a resistor ratio of the resistor divider through the single input pin;
    a first register for storing a first group of bits representing the resistor ratio, wherein the first group of bits comprise least significant bits of the value;
    second circuitry for determining an equivalent resistance of the resistor divider through the single input pin; and
    a second register for storing a second group of bits representing the equivalent resistance, wherein the second group of bits comprise most significant bits of the value associated with the resistor divider.

2. The integrated circuit of claim 1, wherein the first circuitry comprises an analog to digital converter.

3. The integrated circuit of claim 2, wherein the first group of bits comprises five bits and the second group of bits comprises three bits.

4. The integrated circuit of claim 1, wherein the second circuitry further comprises:
    a delta detect circuit for determining the equivalent resistance of the resistor divider responsive to a difference in voltage at the single input pin between when a current is applied to the single input pin and when no current is applied to the single input pin;
    third circuitry for generating a first control signal responsive to a determination that a voltage at the single input pin is greater than half of a difference between two references voltages applied to each end of the resistor divider and for generating a second control signal responsive to the determination that the voltage at the single input pin is less than half of the difference between the two reference voltages;
    a sinking current source that is applied as the current to the single input pin responsive to the first control signal; and
    a sourcing current source that is applied as the current source to the single input pin responsive to the second control signal.

5. The integrated circuit of claim 4, wherein the third circuitry further comprises a comparator for comparing the voltage at the single input pin with a reference value, wherein the reference value equals half of the difference between the two reference voltages applied to each end of the resistor divider.

6. The integrated circuit of claim 1, wherein the second circuitry further comprises a non-linear analog to digital converter.

7. The integrated circuit of claim 1, wherein the second circuitry further comprises an absolute value digital subtractor.

8. The integrated circuit of claim 1 further including a resistor connected between the single input pin and the resistor divider.

9. The integrated circuit of claim 1 further including:
    a second input; and
    a series switch associated with the second input for disconnecting a reference voltage from the resistor divider.

10. An n-bit analog to digital reader for determining a value associated with a resistor divider, comprising:
    a current source having a first mode of operation wherein no current is provided and a second mode of operation wherein a current source or current sink is provided;
    an analog to digital converter for generating a first digital value responsive to an analog value associated with the resistor divider in the first mode of operation and for generating a second digital value responsive to the analog value associated with the resistor divider in the second mode of operation;
    a first register for storing the first digital value and the second digital value generated by the analog to digital converter;
    comparison logic for determining if the first and second digital values stored within the first register substantially equals an output of the analog to digital converter in the first and second modes of operation;
    a second register for storing the first digital value from the first register responsive to a plurality of determinations by the comparison logic of the first digital value stored within the first register substantially equaling the output of the analog to digital converter, wherein a most significant bit portion of the first digital value comprises a least significant bit portion of the value associated with the resistor divider network;
    subtraction logic for performing a subtraction operation on the first digital value stored in the second register and the second digital value stored in the first register to generate a subtracted value;
    a decoder for performing a decoding operation on the subtracted value to generate a most significant bit portion of the value associated with the resistor divider; and
    an output register for storing in a most significant bits position the most significant bit portion of the value associated with the resistor divider from the decoder and for storing in a least significant bits position of the least significant bit portion of value associated with the resistor divider from the second register.

11. The n-bit analog to digital converter of claim 10, wherein the current source is configured as the current source or the current sink responsive to most significant bits of the first digital value stored in the second register and the second digital value stored in the first register.

12. The n-bit analog to digital converter of claim 10, wherein the decoding operation is a non-linear decoding operation.

13. The n-bit analog to digital converter of claim 10, wherein the subtraction logic is configured to subtract the first digital value of the second register from the second digital value of the first register when the current source is configured as a current source and the subtraction logic is configured to subtract the second digital value of the first register from the first digital value of the second register when the current source is configured as a current sink.

14. The n-bit analog to digital converter of claim 10, wherein the reader comprises an 8-bit reader, the most significant bit portion comprises a 3-bit value and the least significant bit portion comprises a 5-bit value.

15. The n-bit analog to digital converter of claim 10 further including control logic for controlling operation of the n-bit analog to digital converter, the first register, the second register, the subtraction logic, the current source and the output register.

16. A method for determining a value associated with a resistor divider using a single input pin of an integrated circuit, comprising the steps of:
    determining a resistor ratio of the resistor divider through the single input pin;
    storing a first group of bits representing the resistor ratio, wherein the first group of bits comprise least significant bits of the value associated with the resistor divider;
    determining an equivalent resistance of the resistor divider through the single input pin;
    storing a second group of bits representing the equivalent resistance, wherein the second group of bits comprise most significant bits of the value associated with the resistor divider; and
    combining the first group of bits with the second group of bits to determine an N-bit value associated with the resistor divider.

17. The method of claim 16, wherein the first group of bits comprises five bits and the second group of bits comprises three bits.

18. The method of claim 16, wherein the step of determining further comprises the steps of:
    determining a first voltage at the single input pin when no current is applied to the single input pin;
    determining a second voltage at the single input pin when a current is applied to the single input pin; and
    determining the equivalent resistance of the resistor divider responsive to a difference in first voltage and the second voltage.

19. The method of claim 18, further including the steps of:
    comparing a voltage at the single input pin with a difference between two reference voltages applied to each end of the resistor divider;
    generating a first control signal responsive to a determination that the voltage at the single input pin is greater than half of the difference between two references voltages applied to each end of the resistor divider; and
    generating a second control signal responsive to the determination that the voltage at the singe input pin is less than half of the difference between the two reference voltages;
    applying a sinking current source as the current to the single input pin responsive to the first control signal; and
    apply a sourcing current source as the current source to the single input pin responsive to the second control signal.

20. The method of claim 16 further including the step of disconnecting a reference voltage from the resistor divider after the value associated with the single input pin is determined.

* * * * *